US009264158B2

(12) United States Patent
Okabayashi

(10) Patent No.: US 9,264,158 B2
(45) Date of Patent: Feb. 16, 2016

(54) AUDIO SIGNAL PROCESSING APPARATUS

(75) Inventor: Masaaki Okabayashi, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 868 days.

(21) Appl. No.: 13/436,486

(22) Filed: Mar. 30, 2012

(65) Prior Publication Data

US 2012/0250888 A1 Oct. 4, 2012

(30) Foreign Application Priority Data

Mar. 31, 2011 (JP) ................................ 2011-077786

(51) Int. Cl.

*H03G 3/00* (2006.01)
*H04H 60/04* (2008.01)
*H04R 3/04* (2006.01)
*H04R 5/04* (2006.01)

(52) U.S. Cl.

CPC ................. *H04H 60/04* (2013.01); *H04R 3/04* (2013.01); *H04R 5/04* (2013.01); *H04R 2430/01* (2013.01); *H04R 2430/03* (2013.01)

(58) Field of Classification Search

CPC ........... H04B 1/00; H04H 60/04; H04H 7/00; H04R 29/007; H04R 29/008; H04R 27/00; H04R 2227/003; H04S 1/007; G06F 3/00; G10H 1/0041; G10H 1/02; G10H 1/34; G10H 1/36; G10H 1/40; G10H 2240/016; G10H 2240/311; G10H 2230/241; G10H 7/002; Y10S 84/12; Y10S 84/25

USPC ......... 381/101, 102, 103, 104, 106, 107, 108, 381/109, 110, 118, 119, 120, 123; 700/94

See application file for complete search history.

(56) References Cited

U.S. PATENT DOCUMENTS

| | | | | |
|---|---|---|---|---|
| 2005/0054305 | A1* | 3/2005 | Hagiwara et al. ............. | 455/126 |
| 2007/0058823 | A1* | 3/2007 | Terada .......................... | 381/119 |

FOREIGN PATENT DOCUMENTS

| | | | |
|---|---|---|---|
| CN | 101421952 | A | 4/2009 |
| EP | 1434372 | A2 | 6/2004 |
| EP | 1513277 | A2 | 3/2005 |

(Continued)

OTHER PUBLICATIONS

SL9K, SL 9000 J Series Total Studio System, Console Operators Manual, Solid State Logic Ltd., p. 1-415, Dec. 1994.*

(Continued)

*Primary Examiner* — Leshui Zhang

(74) *Attorney, Agent, or Firm* — Morrison & Foerster LLP

(57) ABSTRACT

An audio signal processing apparatus has a plurality of channels for controlling a plurality of audio signals. In the apparatus, a volume setting unit sets volume parameters of the plurality of channels. A group generation unit determines a plurality of groups each including one or more channels among the plurality of channels. An attenuation setting unit sets an attenuation amount for each group. An on/off setting unit sets each group to either an on-state or an off-state. A plurality of volume controllers control the plurality of channels, a volume controller of each channel, which belongs to a group in the off-state, controlling a level of the channel and a volume controller of each channel, which belongs to a group in the on-state, generating a volume value by attenuating the volume parameter set to the channel by the attenuation amount set to the group and controlling a level of the channel.

8 Claims, 9 Drawing Sheets

(56) References Cited

FOREIGN PATENT DOCUMENTS

| | | | |
|---|---|---|---|
| EP | 1703652 | A2 | 9/2006 |
| JP | 2005-080265 | A | 3/2005 |
| WO | WO-2007/110576 | A1 | 10/2007 |

OTHER PUBLICATIONS

European Search Report dated Mar. 31, 2104 for EP Application No. 12161942, four pages.

Yamaha. (2006). Digital Mixing Console LS9; LS9-16/LS9-32 Owner's Manual, pp. 121-123, located at http://www2.yamaha.co.ip/manual/pdf/pa/japan/mixers/ls9_ja_om_h0.pdf, last visited Mar. 17, 2011.

Chinese Search Report mailed Mar. 20, 2014, for CN Application No. 201210093282.5, with English translation, four pages.

Notification of the First Office Action dated Mar. 20, 2014, for CN Application No. 201210093282.5, with English translation, ten pages.

Notification of the Second Office Action dated Dec. 4, 2014, for CN Patent Application No. 201210093282.5, with English translation, ten pages.

* cited by examiner

AUDIO SIGNAL PROCESSING APPARATUS

BACKGROUND OF THE INVENTION

1. Technical Field of the Invention

The present invention relates to an audio signal processing apparatus capable of simultaneously muting audio signals of channels belonging to one group among a plurality of channels which process audio signals.

2. Description of the Related Art

A digital mixer is known which is used to adjust voice signals in recording of music or at concerts. A conventional digital mixer has a mute master function.

The mute master function simultaneously switches mute on/off states of all channels belonging to a mute group. A mute group is a group composed of an arbitrary input channel and an arbitrary output channel. An input channel and an output channel can exist together in one mute group. A plurality of channels which needs to switch their mute on/off states is grouped into one mute group. For example, eight mute groups 1 to 8 can be generated, and a mute group is generated depending on a scene using the mute group. Examples of the mute group include a mute group including all channels, a mute group including channels muted during a talk or applause inserted in a song, etc.

In the mute groups 1 to 8, an input channel/output channel is allocated to a selected mute group by pressing a [SEL] key provided to a channel strip of the input channel/output channel. Subsequently, when one of mute group master buttons 1 to 8 is pressed, mute on/off states of all channels belonging to the corresponding mute group are inverted.

Patent Reference 1

Japanese Patent Application publication No. 2005-80265

Non-Patent Reference 1

Yamaha Digital Mixing Console LS9 Instruction Manual, P. 121-123, [online], [Searched 17$^{th}$ date of March, 2011], Internet <http://www2.yamaha.co.jp/manual/pdf/pa/japan/mixers/1s9_ja_om_h0.pdf>

At a music event, a monitor level of a musician is set to a high level such that it can endure playing with a large volume in many cases. In this case, the monitor level may overly increase during a quiet song or MC timing when an MC talks, resulting in howling. Furthermore, a player may want to temporarily decrease the depth of reverberation when introducing band members while playing music with deep reverberation. Though a conventional digital mixer can mute all channels belonging to a mute group, however, volumes of all the channels are completely muted. Therefore, when a mute group including input channels of audio signals monitored by a musician is muted, it is impossible to monitor the audio signals. When a mute group including output channels transmitting audio signals to a reverberator is muted, reverberation is not applied to any audio signal output to a venue.

SUMMARY OF THE INVENTION

Therefore, an object of the present invention is to provide an audio signal processing apparatus capable of maintaining the volume of an audio signal at a reduced level rather than completely muting the audio signal depending on the purpose of muting.

To accomplish the object of the present invention, there is provided an audio signal processing apparatus having a plurality of channels for controlling characteristics of a plurality of audio signals, the audio signal processing apparatus comprising: a volume setting unit that sets volume parameters of the plurality of channels according to a first user operation; a group generation unit that determines a plurality of groups each including one or more channel among the plurality of channels according to a second user operation; an attenuation setting unit that sets an attenuation amount for each group according to a third user operation; an on/off setting unit that sets each group to either of an on-state or an off-state according to a fourth user operation; and a plurality of volume controllers that are provided in correspondence to the plurality of channels, a volume controller of each channel, which belongs to a group in the off-state, controlling a level of the audio signal of the channel according to the volume parameter set to the channel and, on the other hand, a volume controller of each channel, which belongs to a group in the on-state, generating a volume value by attenuating the volume parameter set to the channel by the attenuation amount set to the group and controlling a level of the audio signal of the channel according to the generated volume value.

According to the present invention, attenuation amount is set for each mute group and each channel belonging to a certain mute group is attenuated by the attenuation amount of the mute group when this mute group is muted. Accordingly, it is possible to simultaneously decrease volumes of a plurality of monitor channels to levels at which howling is not caused when a mute group including the monitor channels is muted. Furthermore, when a mute group composed of channels to which deep reverberation is applied is muted, it is possible to simultaneously decrease a plurality of send levels of audio signals to a reverberator. Here, reverberation does not disappear since the send levels are maintained to a certain degree. In this regard, the term "mute" does not mean completely silencing sound, but means decreasing a volume in many occasions in the description.

DETAILED DESCRIPTION OF THE INVENTION

Figure 1:
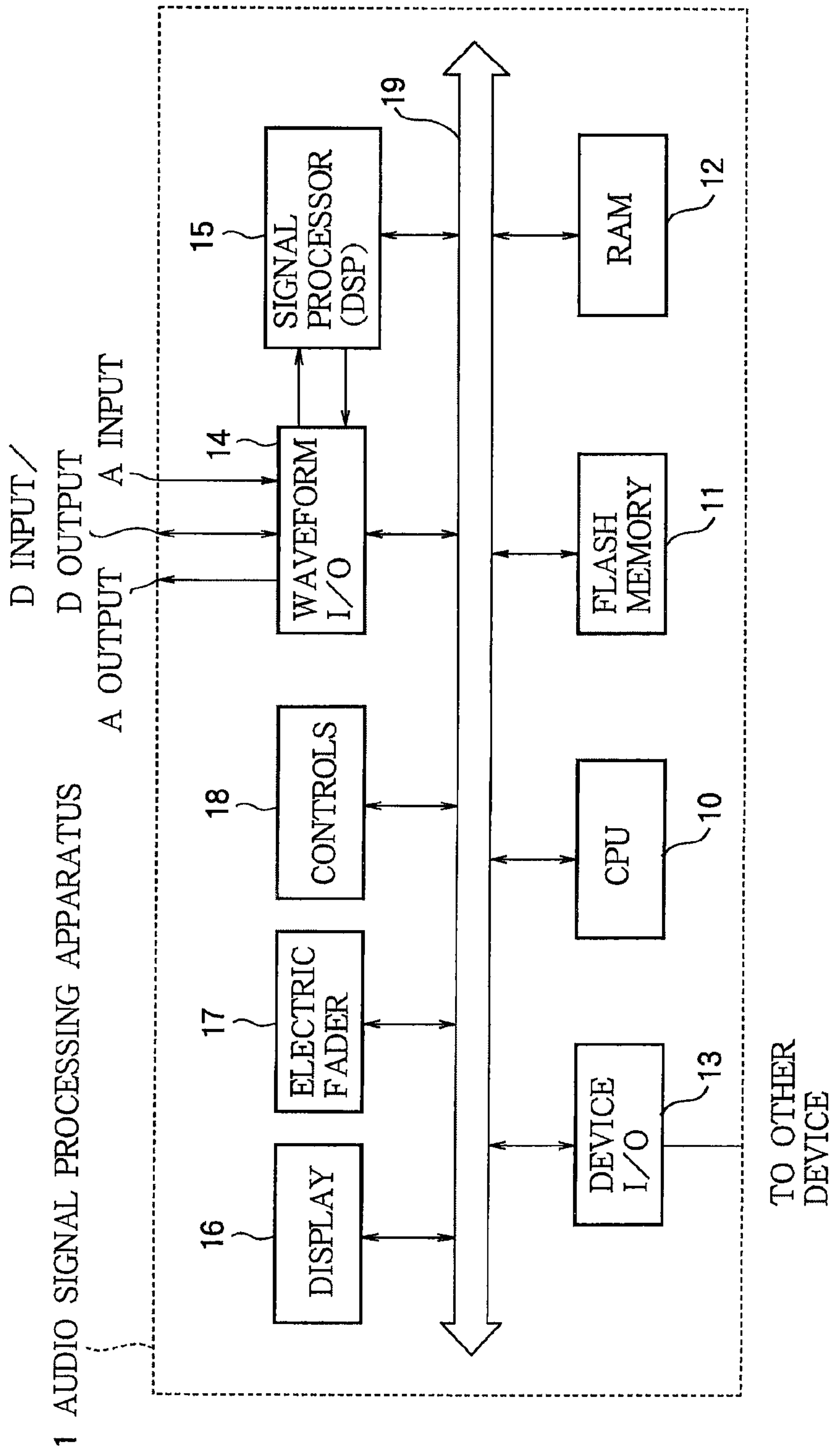
FIG. 1 is a block diagram showing a configuration of an audio signal processing apparatus according to an embodiment of the present invention.

A block diagram showing a configuration of an audio signal processing apparatus according to an embodiment of the present invention is shown in FIG. 1.

The audio signal processing apparatus 1 according to an embodiment of the present invention, shown in FIG. 1, includes a CPU (Central Processing Unit) 10 which controls the overall operation of the audio signal processing apparatus 1 and generates control signals according to operations of control parts provided to a panel, a rewritable nonvolatile flash memory 11 which is a computer readable storage medium for storing operating software such as an audio signal processing program executed by the CPU 10, and a RAM (Random Access Memory) 12 storing a work area of the CPU 10 or various data items. Since the operating software is stored in the flash memory 11, version update of the operating software can be performed by rewriting the operating software stored in the flash memory 11. Furthermore, other devices such as a digital recorder and the like are connected to the audio signal processing apparatus 1 via a device I/O (an input/output interface) 13.

All inputs and all outputs of the audio signal processing apparatus 1 are performed through a waveform I/O (waveform interface) 14. The waveform I/O 14 includes a plurality of A input ports to which analog signals are input, a plurality of A output ports through which analog signals are output, and a plurality of D input/D output ports for receiving external digital signals and outputting digital signals. A signal processor 15 is configured using one or more DSPs (Digital Signal Processors) executing a multi-step micro-program every sampling period of an audio signal. The signal processor 15 performs mixing processing and effect processing on audio signals under the control of the CPU 10. A display 16 is configured with a liquid crystal display which displays a screen set according to audio signal processing. An electric fader 17 is a volume setting unit which adjusts an input channel signal level or an output channel signal level. The electric fader 17 can control signal levels manually or using electric power. A set of controls 18 is provided to a panel including an assignment switch for assigning channel strips as many as the number of a plurality of channels (referred to as CHs hereinafter) to input channels or output channels, a cursor key for moving a cursor displayed on the display 16, an increase/decrease key for increasing/decreasing a set value, a rotary encoder for selecting a set value, and an enter key for deciding a set value. These components are connected to a bus 19.

Figure 2:
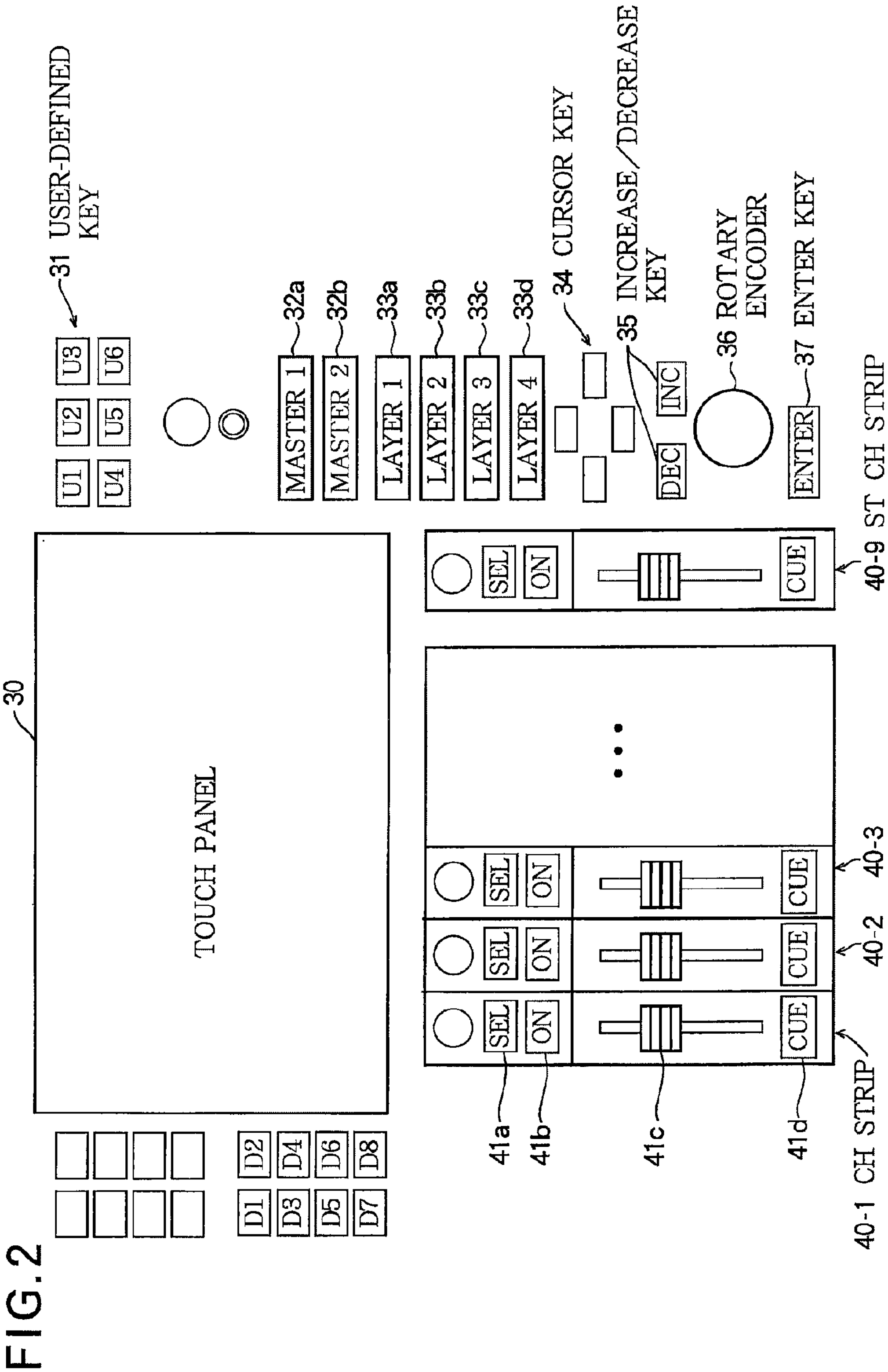
FIG. 2 shows a configuration of a panel of the audio signal processing apparatus according to an embodiment of the present invention.

The configuration of the panel including the controls 18 in the audio signal processing apparatus 1 according to the present invention is shown in FIG. 2.

Referring to FIG. 2, eight CH strips 40-1, 40-2, 40-3, . . . and one ST CH strip 40-9 for stereo are arranged below a touch panel 30 corresponding to the display 16. Each of the eight CH strips 40-1, 40-2, 40-3, . . . includes a SEL switch 41*a* for selecting a CH assigned to the corresponding CH strip, an ON SW 41*b* for on/off of the CH, a fader switch 41*c* in the electric fader 17 for controlling a level of the assigned CH, and a CUE switch 41*d* for checking the assigned CH. The ST CH strip 40-9 also includes the SEL switch 41*a*, ON SW 41*b*, fader switch 41*c* and CUE switch 41*d*. When the SEL switch 41*a* is pressed, a screen for setting detailed parameters of a CH assigned to a CH strip corresponding to the pressed SEL switch 41*a* is displayed on the touch panel 30 such that the parameters can be set, or the corresponding CH can be included in a group such as a mute group.

When a button 32*a* corresponding to "master 1" provided to a middle part of the right side of the panel is pressed, output CH1 to output CH8 corresponding to outputs of a MIX bus are assigned to eight CH strips 40-1, . . . . When a button 32*b* corresponding to "master 2" is pressed, output CH9 to output CH16 are allocated to the eight CH strips 40-1, . . . . In this manner, the output CH1 to output CH16 can be controlled using the eight CH strips 40-1, . . . by switching the buttons 32*a* and 32*b*. Furthermore, input CH1 to input CH8 are allocated to the 8 CH strips 40-1, . . . when a button 33*a* corresponding to "layer 1" located under "master 2" is pressed, and input CH9 to input CH16 are allocated to the eight CH strips 40-1, . . . when a button 33*b* corresponding to "layer 2" is pressed. In addition, input CH17 to input CH24 are allocated to the eight CH strips 40-1, . . . when a button 33*c* corresponding to "layer 3" is pressed, and input CH25 to input CH32 are allocated to the eight CH strips 40-1, . . . when a button 33*d* corresponding to "layer 4" is pressed. In this manner, the input CH1 to input CH32 can be controlled using the eight CH strips 40-1, . . . by switching the buttons 33*a*, 33*b*, 33*c* and 33*d*.

As described above, it is possible to control levels of 16 output channels and 32 input channels and set CUE for every eight channels using the eight CH strips 40-1, . . . . That is, the eight CH strips 40-1, . . . can respectively control every eight input channels or output channels for all the input channels and all the output channels. Further, level control of a stereo CH and CUE setting can be controlled by means of the ST CH strip 40-9.

A cursor key 34 for moving the cursor displayed on the touch panel 30 upward, downward, left and right, an increase/decrease key 35 for increasing/decreasing various set values, a rotary encoder 36 for selecting various set values, and an enter key 37 for deciding set values selected by the increase/decrease key 35 and rotary encoder 36 and an object selected by the cursor are arranged below the button 33*d* corresponding to "layer 4". In addition, six user-defined keys (U1 to U6) 31 for executing a previously programmed function such as an on/off function are provided to the top of the right side of the panel. The user-defined keys (U1 to U6) 31 are configured such that they can be assigned different functions. When mute group master buttons for switching mute on/off states are assigned to the user-defined keys 31, it is possible to switch on/off states of assigned mute groups by pressing the user-defined keys (U1 to U6) 31. The mute group master function simultaneously switches mute on/off states of all channels belonging to a mute group.

Figure 3:
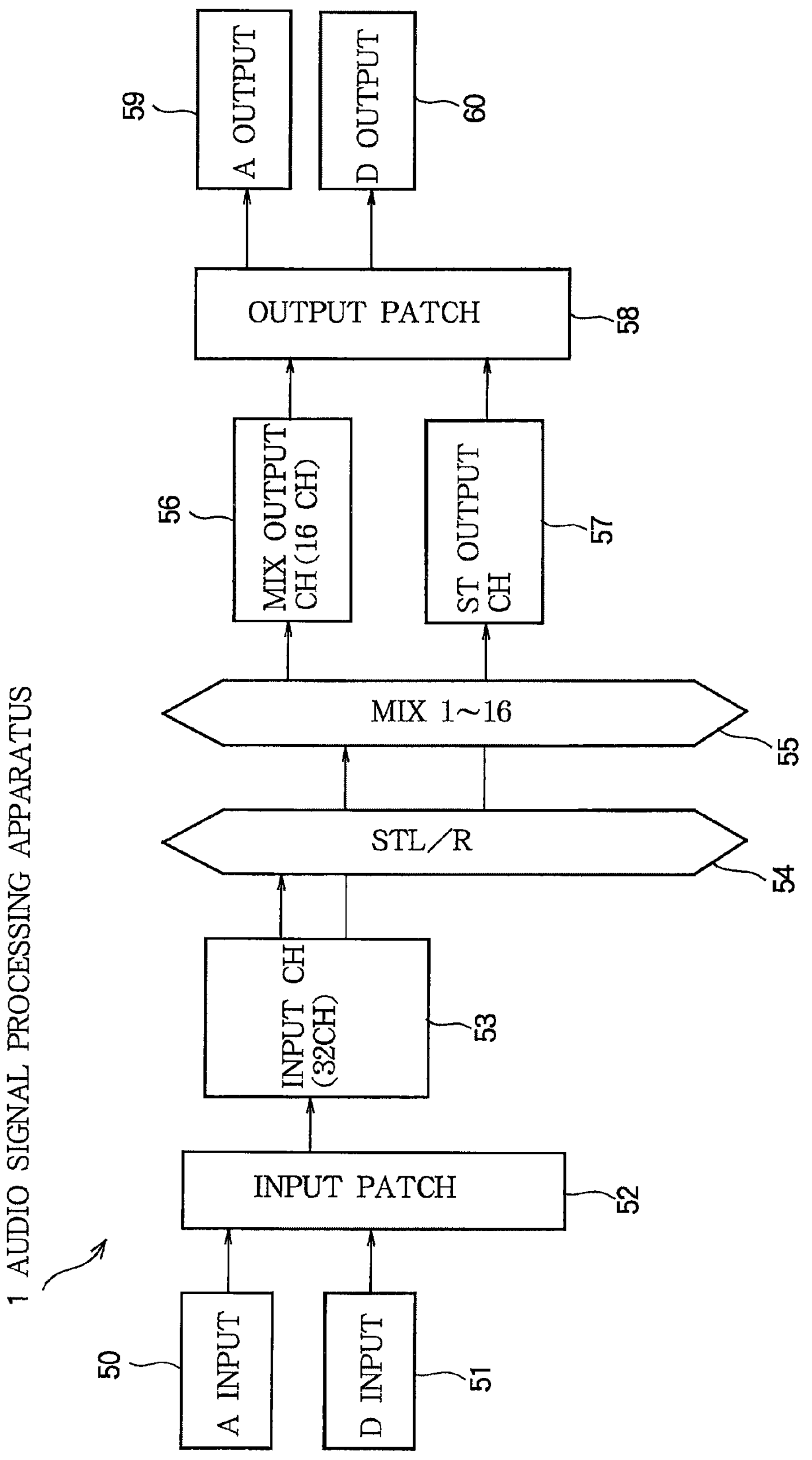
FIG. 3 is a block diagram showing an equivalent circuit of signal processing in the audio signal processing apparatus according to an embodiment of the present invention.

An equivalent circuit of signal processing in the audio signal processing apparatus 1 according to the present invention is shown in FIG. 3.

Referring to FIG. 3, analog signals input to a plurality of analog input ports (A input) 50 are converted into digital signals by an AD converter included in the waveform I/O 14 and applied to an input patch 52. Digital signals input to a plurality of digital input ports (D input) 51 are applied to the input patch 52 without being converted. The input patch 52 can selectively patch (connect) one of the plurality of input ports to which signals are input to each of a plurality of (e.g., 32) input channels included in an input channel unit 53. Each input channel is provided with an audio signal from an input port patched by the input patch 52.

Each input channel in the input channel unit 53 includes an attenuator, an equalizer, a compressor and a gate, a fader, and a send adjustor for adjusting a send level of a signal to a stereo (ST) bus 54 and to a mixing (MIX) bus 55. In the input channels, frequency balance and level control and the send level of a signal to the ST bus 54 and MIX bus 55 are adjusted. 32-channel digital signals output from the input channel unit 53 are applied to the ST bus 54 and selectively to one or more MIX buses MIX1 to MIX16. One or more digital signals selectively input from arbitrary input channels of the 32 input channels are mixed in the ST bus 54, and a mixed output of the stereo channel L/R 54 is output to an ST output channel unit 57. The one to a plurality of digital signals selectively input from the arbitrary channels of the 32 input channels are mixed in the 16 buses of the MIX bus 55 and a 16-channel mixed output is applied to a MIX output channel unit 56. Accordingly, one-channel stereo output and 16-channel mixed output can be obtained.

An attenuator, an equalizer, a compressor, and a fader are provided to each output channel of the ST output channel unit 57 and the MIX output channel unit 56, and frequency balance and level adjustment and a level sent to an output patch 58 are controlled in the output channels. The output patch 58 can selectively patch (connect) one of the one-channel stereo signal and 16 output channel signals from the ST output channel unit 57 and MIX output channel unit 56 to which signals are input to each output port of an analog output port unit (A output) 59 and a digital output port unit (D output) 60, and each output port is provided with a signal from a channel patched by the output patch 58.

Further, a digital signal supplied to the analog output port unit (A output) 59 including a plurality of analog output ports is converted into an analog output signal by a DA converter included in the waveform I/O 18 and output from the analog output port unit 59. The analog output signal outputted from the analog output port unit (A output) 59 are amplified and output from a main speaker. The analog output signal is supplied to an in-ear monitor set in an ear of a user or reproduced in a stage monitor speaker located in proximity to the user. A digital audio signal output from the digital output port unit (D output) 60 including a plurality of digital output ports can be supplied to a recorder and an external DAT to be digitally recorded.

Figures 4A, 4B:
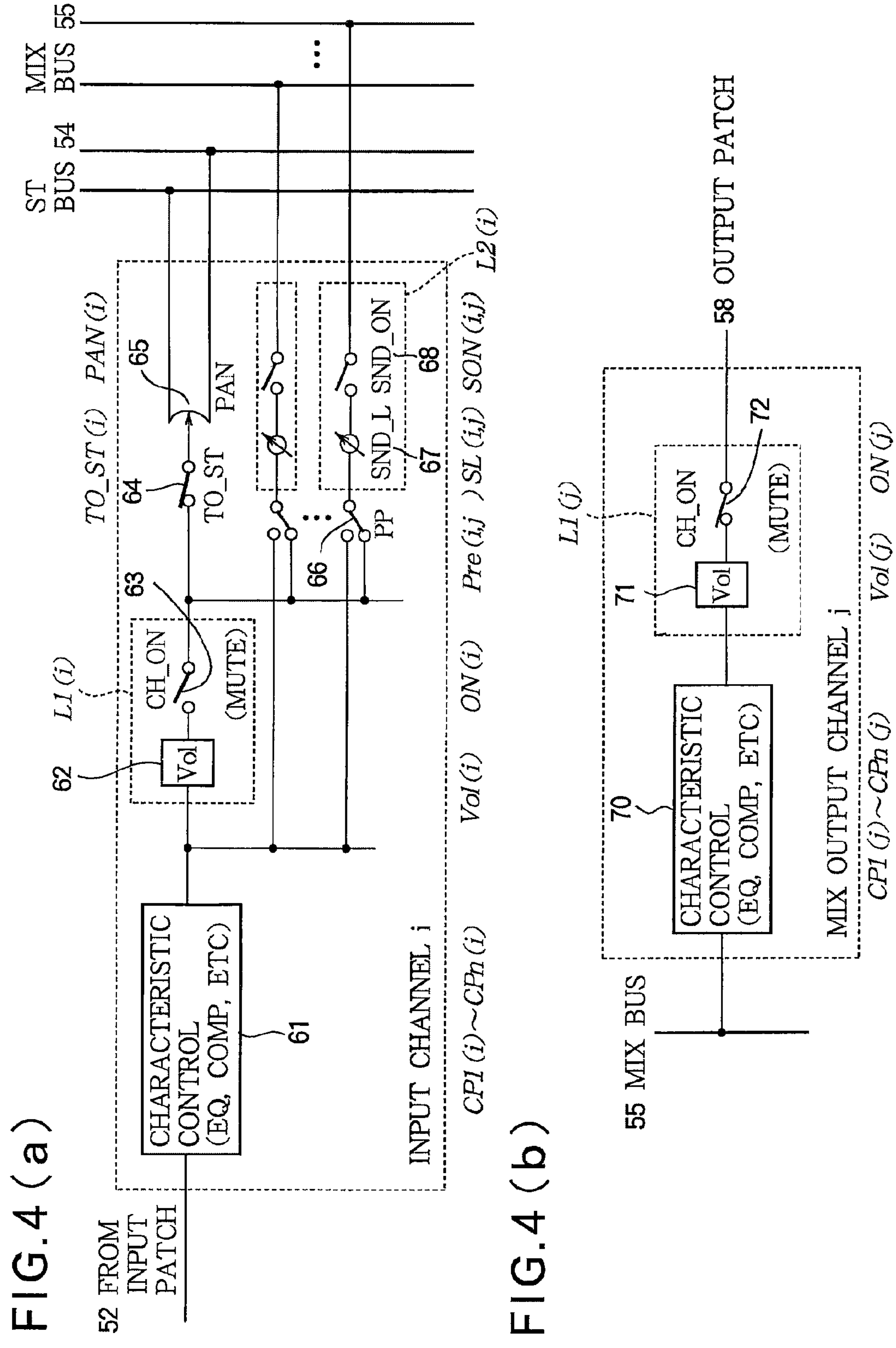
FIGS. 4(*a*) and 4(*b*) are circuit diagrams showing a configuration of an input channel and an output channel in the audio signal processing apparatus according to an embodiment of the present invention.

FIG. 4(*a*) is a block diagram showing a configuration of an i-th input channel i of the input channel unit 53.

In the input channel i, a characteristic controller 61, a fader (Vol) 62, an ON SW (CH_ON) 63, a ST switch (TO_ST) 64, and a pan 65 are connected to a path for transmitting an input signal to the ST bus 54. The characteristic controller 61 includes components controlling characteristics of audio signals, such as an equalizer (EQ) for adjusting the frequency characteristic of an input signal, and a compressor (COMP) for compressing the dynamic range of the input signal. The fader (Vol) 62 is a volume setting unit which adjusts an input level of the input channel i. The ON SW (CH_ON) 63 switches on and off states of the input channel i. The ST switch (TO_ST) 64 is an on/off switch for an input signal applied to the ST bus 54. The pan 65 sets levels of L and R signals such that a sound phase is set in a predetermined location and respectively supplies the L and R signals to L and R of the ST bus 54.

In addition, the input channel i includes 16 paths having the same configuration, through which input signals are supplied to the MIX bus 55. The characteristic controller 61, a pre-post switch (PP) 66, a send level adjustor (SND_L) 67, and a send switch (SND_ON) 68 are connected to each of the paths for supplying input signals to the MIX bus 55. The pre-post switch (PP) 66 selects one of a pre-fader signal prior to being input to the fader 62 and a post-fader signal that has passed through the fader 62. The send level adjustor (SND_L) 67 adjusts a send level of a signal input to the MIX bus 55 and the send switch (SND_ON) 68 switches on/off an input signal applied to the MIX bus 55. The 16 paths for supplying input signals to 16 channels of the MIX bus 55 have the same configuration. In each path for supplying an input signal to the MIX bus 55, an input signal is supplied to each channel of the MIX bus 55 through the same circuit configuration as the above-described path.

Parameters in the current memory (RAM 12), which controls the components of the input channel i, are indicated in italics. CP1(*i*) to CPn(i) are n parameters used in the characteristic controller 61, and the frequency characteristic of the equalizer and the volume characteristic of the compressor are controlled on the basis of these parameters. Vol(i) is a parameter of the fader 62 indicating a volume parameter, and the volume of an audio signal is controlled on the basis of the volume parameter Vol(i) in the fader 62 of the input channel i. ON(i) is a parameter of the ON SW 63. An audio signal passes through the ON SW 63 in the input channel i when ON(i) is "1" and the audio signal does not pass through the ON SW 63 when this parameter is "0". Pre(i, j) is a parameter of the pre-post switch 66. An audio signal sent from the input channel i to a MIX bus j is acquired prior to the fader 62 (pre-fader) when ON(i) is "1" and the audio signal is acquired after the ON SW 63 of the input channel i (post fader) when the parameter is "0". SL(i, j) is a parameter of the send level adjustor 67, and the volume of an audio signal sent from the input channel i to the MIX bus j is controlled on the basis of the parameter SL(i, j). SON(i, j) is a parameter of the send switch 68. An audio signal is sent from the input channel i to the MIX bus j when this parameter is "1" and the audio signal is not sent when this parameter is "0". In (i, j), i indicates the number of an input channel and j indicates the number of an output channel (MIX CH). The CPU 10 performs multiplication (addition in case of [dB]) on the two parameters Vol(i) and ON(i) of the fader 62 and the ON SW 63, shown in a broken line box to generate a coefficient L1(*i*). The signal processor (DSP) 15 multiplies an audio signal by the generated coefficient L1(*i*) in a step (specific step) of a microprogram for processing the fader 62 and the ON SW 64 of the input channel i. That is, the two components, the fader 62 and the ON SW 63, are implemented by the CPU 10 and the DSP 15 in cooperation with each other, and the DSP 15 multiplies the audio signal by the coefficient L1(*i*) only once. Further, a coefficient L2(*i*) is generated for the send level adjustor 67 and the send switch 68 shown in a broken line box and treated in the same manner. When the ON SW 63 of the input channel is in an on-state and a group g including the input channel i is muted, the coefficient L1(*i*) of the input channel i is not limited to 0 (corresponding to attenuation amount of $-\infty$[dB]) and depends on attenuation amount Att(g) of the group g at that moment. The attenuation amount Att(g) of the group g can be set by a user to an arbitrary value when a mute group is manipulated, which will be described later. The level of the input channel i is reduced (not silenced) by the set attenuation amount, and thus a volume level is still maintained to a certain degree when the group g is muted.

FIG. 4(*b*) is a block diagram showing a configuration of a j-th output channel j of the MIX output channel unit 56.

In the output channel j, a characteristic controller 70, a fader (Vol) 71 and a mute switch (CH_ON) 72 are connected to a path for sending an output signal from the MIX bus 55 to the output patch 58. The characteristic controller 70 corresponds to the characteristic controller 61 and includes components for controlling characteristics of audio signals, such as an equalizer (EQ) for adjusting the frequency characteristic of an output signal, a compressor (COMP) for compressing the dynamic range of the output signal, etc. The fader (Vol) 71 is a volume setting unit which adjusts an output level of the output channel j. The ON SW (CH_ON) 72 is an on/off switch for the output channel j. The ST output channel unit 57 has the same configuration as the MIX output channel unit 56 except that it has two stereo L and R channels. In the ST output channel unit 57, parameters of respective blocks interwork or link in L and R channels.

Parameters in the current memory (RAM 12), which controls the components of the output input channel j, are indicated in italics. CP1(*j*) to CPn(j) are n parameters used in the characteristic controller 70, and the frequency characteristic of the equalizer and the volume characteristic of the compressor are controlled on the basis of these parameters. Vol(j) is a parameter of the fader 71 indicating a volume parameter, and the volume or level of an audio signal is controlled on the basis of the volume parameter Vol(j) in the fader 71 of the output channel j. ON(j) is a parameter of ON SW 72. An audio signal passes through ON SW 72 in the output channel j when ON(j) is "1" and the audio signal does not pass through the ON SW 72 when the parameter is "0". In the output channel j, the CPU 10 performs multiplication (addition in case of [dB]) of the two parameters Vol(j) and ON(j) of the fader 71 and the ON SW 72, shown in a broken line box, to generate a coefficient L1(*j*). The signal processor (DSP) 15 multiplies an audio signal by the generated coefficient L1(*j*) in a step (specific step) of a micro-program for processing the two components of the output channel j. When the ON SW 72 of the output channel j is in an on-state and a group g including the output channel j is muted, the coefficient L1(*j*) of the output channel j is not limited to 0 (−∞[dB]) and depends on attenuation amount Att(g) of the group g at that moment. The attenuation amount Att(g) of the group g can be set by a user. The level of the output channel j is reduced (not silenced) by the set attenuation amount, and thus a volume level is maintained to a certain degree when the group g is muted.

The audio signal processing apparatus 1 has the mute group master function which simultaneously mutes a plurality of channels. A description will be given of methods for generating, setting and operating a mute group in the mute group master function with reference to a mute group screen 2 displayed on the display 16, shown in FIG. 5.

Figure 5:
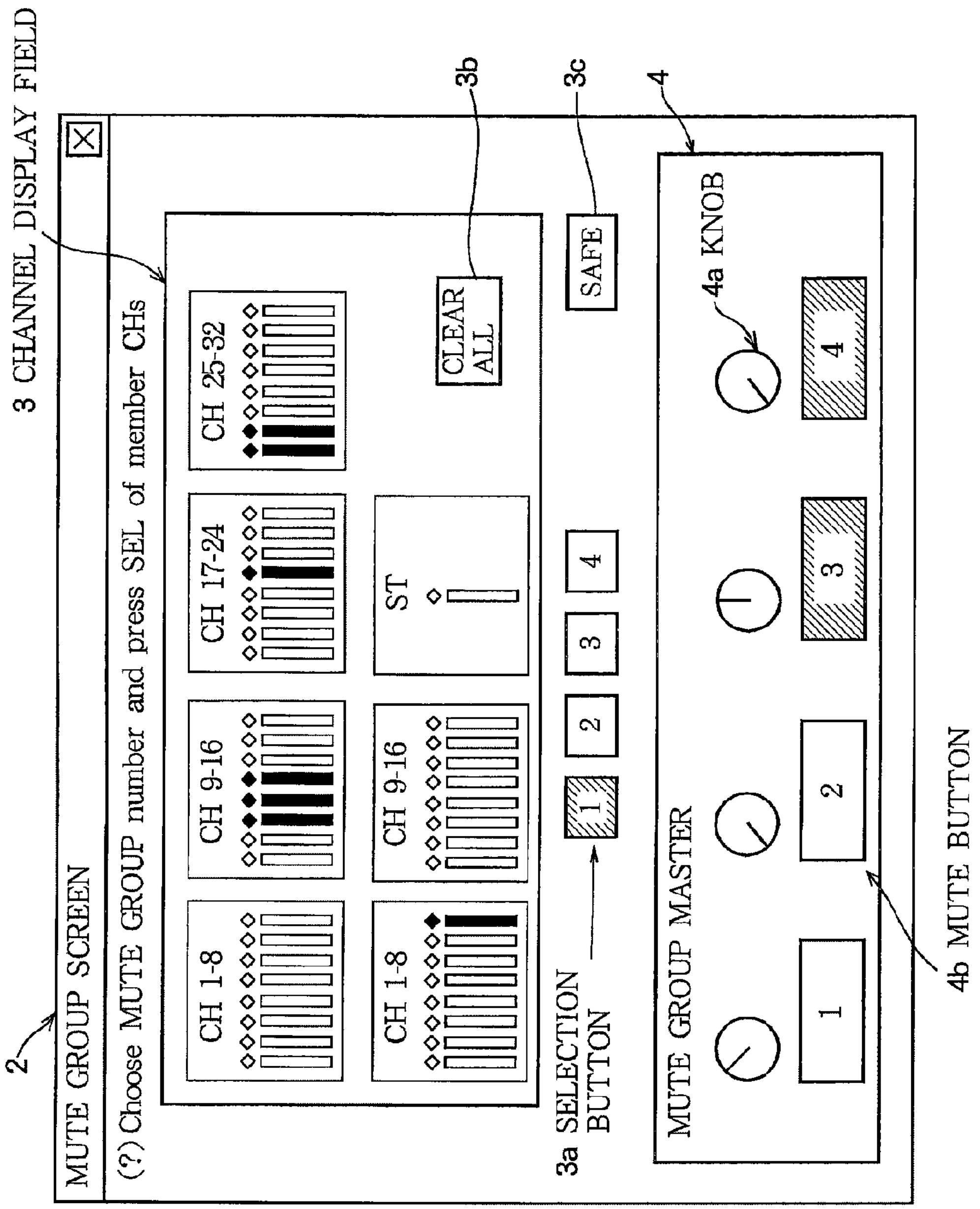
FIG. 5 shows a mute group screen displayed on the audio signal processing apparatus according to an embodiment of the present invention.

A mute group is composed of an arbitrary input channel and an arbitrary output channel. In a mute group, input channels and output channels may exist together. A plurality of channels which simultaneously needs to switch their mute on/off states is grouped into one mute group. In the mute group screen 2 shown in FIG. 5, 32 input channels are sorted into four groups respectively having eight input channels CH1-8, CH9-16, CH17-24 and CH25-32 and displayed in a channel display field 3, and 16 output channels are sorted into two groups respectively having eight output channels MIX1-8 and MIX9-16 and displayed in the channel display field 3. In addition, one stereo channel ST is displayed in the channel display field 3. Selection buttons 3*a* for selecting one of the four mute groups are displayed below the channel display field 3. In FIG. 5, "1" corresponding to mute group 1 is selected. Channels belonging to the selected mute group 1 are highlighted in the channel display field 3. Specifically, seven channels, that is, input CHs 11, 12 and 13 from CH9-16, input CH 21 from CH17-24, input CHs 25 and 26 from CH25-32, and output CHs 8 from MIX1-8 belong to mute group 1.

In the shown example, four mute groups 1, 2, 3 and 4 can be generated as mute groups, and a mute group is generated depending on a scene using the mute group. For example, there is determined a group including a plurality of input channels which process monitoring audio signals of a musician or a group including a plurality of output channels which process audio signals sent to a reverberator.

When a new mute group is generated, the enter key 37 is pressed with the cursor on the selection button 3*a* corresponding to the number of the new mute group. Then, when the enter key 37 is pressed with the cursor on CLEAR ALL button 3*b* displayed in the channel display field 3, channels highlighted on the current channel display field 3 are cancelled simultaneously. Subsequently, when a SEL switch 41*a* corresponding to an input channel or an output channel which needs to be assigned to the new mute group is pressed, the corresponding channel is assigned to the new mute group. In this case, SEL switches 41*a* corresponding to a plurality of channels can be pressed such the plurality of channels belong to the new mute group. The pressed SEL switch 41*a* is turned on and the channel corresponding to the SEL switch 41*a* is highlighted and displayed in red on the channel display field 3 to indicate assignment of the channel. The assignment can be cancelled by pressing the turned on SEL switch 41*a* to turn it off. The user can generate a mute group composed of a desired input channel and output channel according to the aforementioned operation.

A mute group master screen 4 is displayed below the selection buttons 3*a*. Mute buttons 4*b* which are on/off setting parts for setting the four mute groups 1, 2, 3 and 4 to an on-state or off-state and knobs 4*a* respectively arranged above the mute buttons 4*b* are displayed on the mute group master screen 4. The mute buttons 4*b* are mute group master buttons. Attenuation amounts of the four mute groups 1, 2, 3 and 4 when they are muted can be set by means of the knobs 4*a*. When a mute group is muted, levels of channels belonging to the mute group are reduced by a set attenuation amount of the mute group. That is, the knobs 4*a* are attenuation setting parts for setting a desired attenuation level of each mute group, and thus a volume level of a channel, which is maintained even when a mute group including the channel is muted, can be set by adjusting the knob 4*a* corresponding to the mute group. When the cursor is moved to a selected mute button 4*b* and the enter key 37 is pressed, the selected mute button 4*b* is turned on and all channels belonging to the mute group corresponding to the selected mute button 4*b* are muted. At this time, the ON SWs 41*b* of the muted channels flicker. A plurality of mute buttons 4*b* can be selected. In the shown example, mute buttons 1 and 2 are turned on and mute groups 1 and 2 are muted. The mute states of the mute groups 1 and 2 are cancelled by moving the cursor to the turned on mute buttons 1 and 2 and pressing the enter key 37 to turn the mute buttons 4*b* off.

A SAFE button 3*c* displayed on the right of the selection buttons 3*a* is used to temporarily exclude a specific channel from all mute groups. When the enter key 37 is pressed with the cursor located on the SAFE button 3*c* and a SEL switch 41*a* corresponding to a channel that needs to be excluded from mute groups is pressed, the SEL switch 41*a* is turned on and the corresponding channel is highlighted in green in the channel display field 3. The mute safe of the corresponding channel can be cancelled by pressing the turned on SEL switch 41*a* to turn it off. The channel set to a mute safe state is not affected by muting even when the mute group including the channel is muted.

Namely, the audio signal processing apparatus 1 is equipped with a mute safe setting unit including a SAFE button 3*c* that specifies a channel which is temporarily excluded from any of the groups so that the volume value of the specified channel is not affected even when any of the groups to which the specified channel belongs is set to the on-state.

Figure 6:
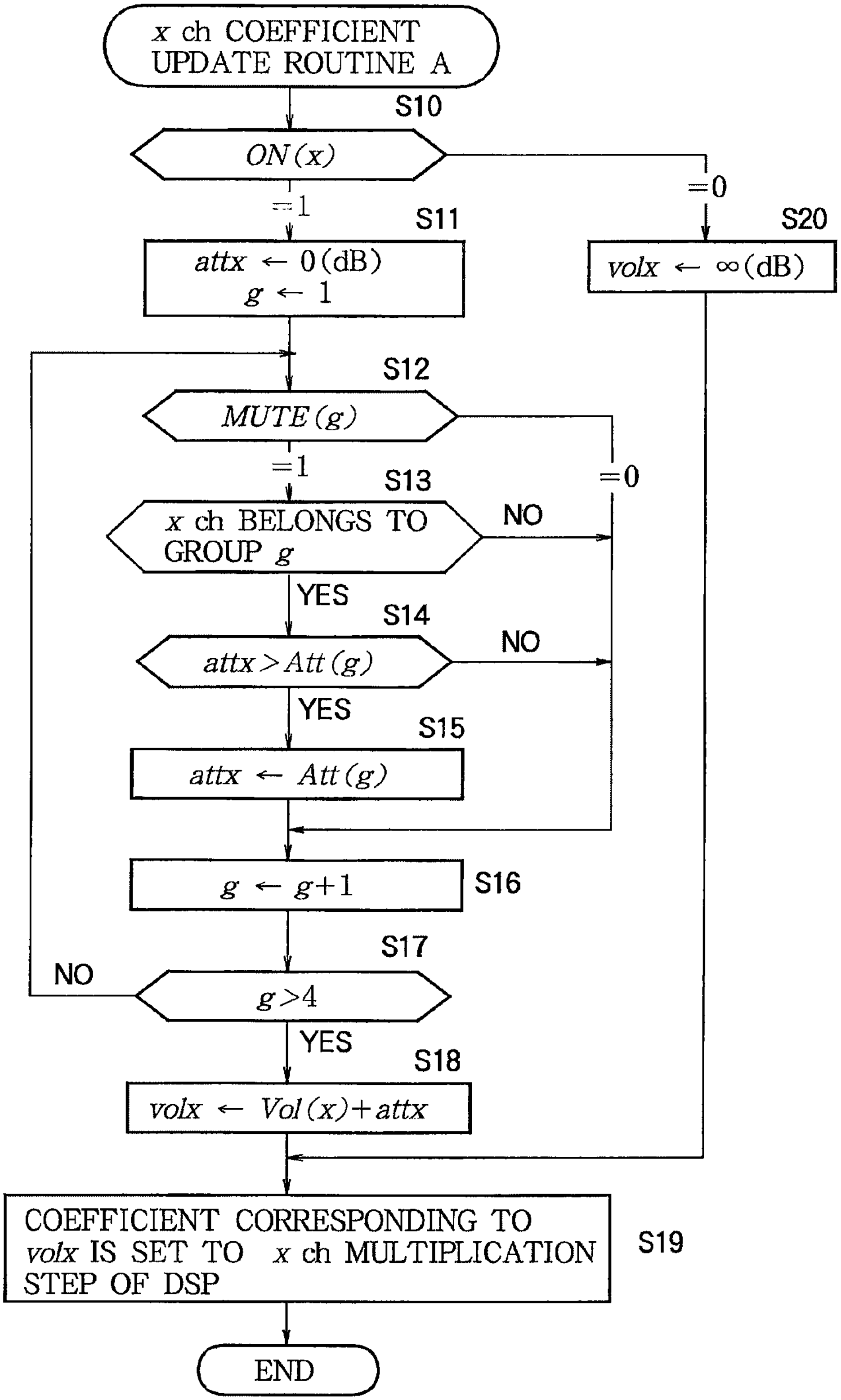
FIG. 6 is a flowchart showing an xch coefficient update routine A executed in the audio signal processing apparatus according to an embodiment of the present invention.

FIG. 6 is a flowchart showing a routine A for updating a coefficient of an x-th channel (xch), which is executed in the audio signal processing apparatus 1, according to an embodiment of the present invention. Here, x is a register which stores a channel number indicating one of a plurality of input channels and a plurality of output channels. The xch coefficient update routine A is part of a procedure executed when the fader switch 41*c* is manipulated, when a mute group knob 4*a* is manipulated, when an ON SW 41*b* corresponding to a certain channel is manipulated, and when a mute button 4*b* corresponding to a certain mute group is manipulated. In FIGS. 6, 7, 8 and 9, parameters and registers are represented in italics.

Upon initiation of the xch coefficient update routine A, parameter ON(x) of the ON SW 63 or 72 corresponding to xch is checked to determine whether ON(x) is "1" (on) or "0" (off) in step S10. When parameter ON(x) is "1", the routine A proceeds to step S11 in which 0 [dB] (corresponding to coefficient 1) is set to a register attx which temporarily stores an attenuation amount. This is because the attenuation amount when the ON SW 63 or 72 is in an on-state is 0 [dB]. In addition, [1] which indicates the first mute group 1 is set to a mute group g. Subsequently, state MUTE(g) of the mute button 4*b* corresponding to the mute group g is checked to determine whether MUTE(g) is "1" (on) or "0" (off) in step S12. When MUTE(g) is "1" and thus the mute group g is determined to be in an on-state, the routine A proceeds to step S13 in which it is determined whether or not xch belongs to the mute group g. When xch belongs to the mute group g, it is determined whether parameter Att(g) of the knob 4*a* corresponding to the mute group g is smaller (attenuation amount is larger) than the value of the register attx in step S14. When the value of Att(g) is smaller (attenuation is larger) than the value of the register attx, the value of Att(g) corresponding to a larger attenuation amount is stored in the register attx in step S15. The number of the mute group g increases by one and the next mute group g+1 is ready for the routine A in step S16. It is determined whether the number of the next mute group g+1 exceeds the number of the last mute group 4 in step S17. When the number of the next mute group g+1 does not exceed the number of the last mute group 4, the routine A returns to step S12 and steps S12 through S17 are re-executed. Steps S12 through S17 are repeated until the number of the next mute group g+1 exceeds the number of the last mute group 4.

When MUTE(g) is "0" and thus the mute group g is determined to be in an off-state in step S12, the coefficient of xch does not need to be updated since xch is not muted. Accordingly, steps S13, 14 and S15 are skipped and the routine A jumps to step S16. When it is determined that xch does not belong to the mute group g in step S13, steps S14 and S15 are skipped since xch coefficient update is not needed. When it is determined that Att(g) is larger (attenuation is smaller) than the value of the register attx in step S14, step S15 is skipped and the value of Att(g) is not renewed.

When steps S12 through S17 are repeated and thus the number of the next mute group g+1 exceeds the number of the last mute group 4, the routine A proceeds to step S18 from step S17 to set a value corresponding to the sum of the value [dB] of the register attx and a volume level Vol(x) [dB] of the fader 62 or 71 of xch to a register volx. A coefficient corresponding to the value of the register volx is set to the signal processor (DSP) 15 as a coefficient of the specific step in a procedure of the signal processor (DSP) 15 to process xch. In this case, the register attx stores the maximum attenuation amount (attenuation amount of a mute group corresponding to the most deeply turned knob or dial 4*a*) among attenuation amounts of all mute groups to which xch belongs according to steps S14 and S15, and a coefficient indicative of the volume value reduced according to the maximum attenuation amount is set to the specific step of xch. Upon completion of step S19, the xch coefficient update routine A is ended. The coefficient of xch corresponds to the above-mentioned coefficient L1(*i*) or L1(*j*). When ON(x) is determined to be "0" in step S10, the routine A branches off to step S20 in which a volume value of $-\infty$[dB] (corresponding to coefficient 0) is set to the register volx and the routine A proceeds to step S19. In this case, since the coefficient (=0) corresponding to the attenuation amount of $-\infty$[dB] is set to xch, a silent audio signal is output from the ON SW 63 or 72 of xch to the following stage regardless of whether mute groups to which xch belongs are muted or not (sound of xch is not output).

Namely, the on/off setting unit including selection buttons 3*a* is capable of setting a plurality of groups to the on-state at the same time. In such a case, the volume controller comprised of CPU 10 generates a volume value by attenuating the volume parameter set to the corresponding channel by a maximum attenuation amount among a plurality of the attenuation amounts of the groups to which the corresponding channel belongs when the groups are in the on-state, and controls the level of the audio signal of the corresponding channel according to the generated volume value.

Figure 7:
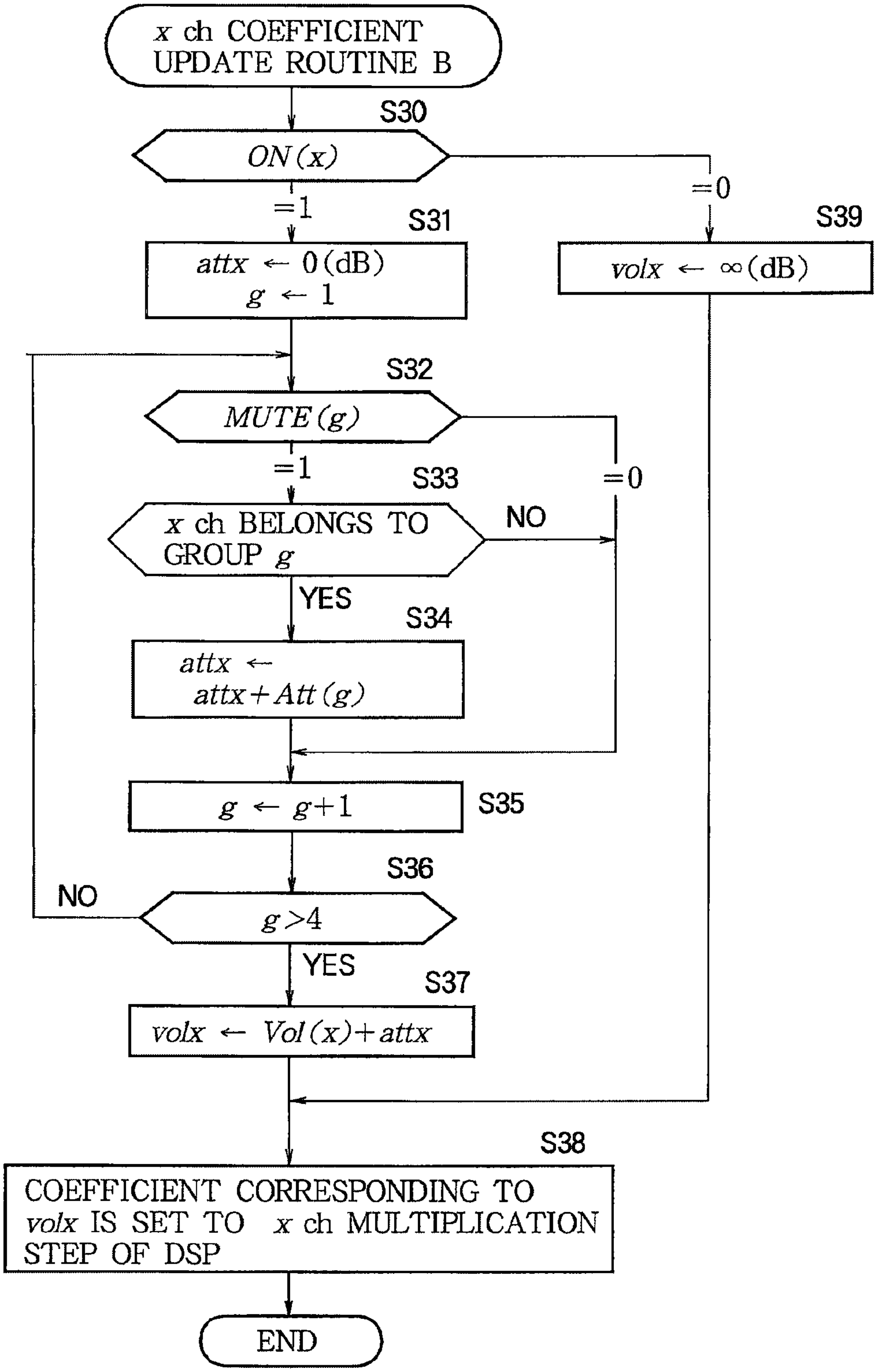
FIG. 7 is a flowchart showing an xch coefficient update routine B executed in the audio signal processing apparatus according to an embodiment of the present invention.

FIG. 7 is a flowchart showing an xch coefficient update routine B executed in the audio signal processing apparatus 1 as a substitute for the xch coefficient update routine A according to an embodiment of the present invention. Steps S30, S31, S32 and S33 of the xch coefficient update routine B correspond to steps S10, S11, S12 and S13 of the xch coefficient update routine A and, as such, explanations thereof are omitted. When xch is determined to belong to the mute group g in step S33, parameter Att(g) [dB] of the knob 4*a* corresponding to the mute group g is added to the value [dB] of the register attx and stored in the register attx in step S34. When steps S32 through S36 are repeated by the number of mute groups, the value of the register attx becomes accumulation or summation of attenuation amounts Att(g) of all mute groups g to which xch belongs. Steps S35 through S39 correspond to steps S16 through S20 of the xch coefficient update routine A and, such, explanations thereof are omitted.

In the xch coefficient update routine B, the attenuation amount set by means of the knob 4*a* corresponding to each mute group to which xch belongs is added to the previous value of the register attx and stored in the register attx in step S34. That is, a value, obtained by adding the value [dB] of the register attx to the volume level Vol(x) of the fader 62 or 71 of xch, is set to the register volx in step S37. In this case, the value of the register attx corresponds to sum of attenuation amounts Att(g) of all the mute groups g to which xch belongs. A coefficient corresponding to the value of the register volx is set to the signal processor (DSP) 15 as a coefficient of the specific step in the procedure of the DSP 15 to process xch. Upon completion of step S38, the xch coefficient update routine B is finished. In the xch coefficient update routine B, since the attenuation of each mute group in a mute state among the mute groups to which xch belongs works, the attenuation amount of xch when a plurality of mute groups is muted becomes larger than the attenuation amount in the coefficient update routine A.

Namely, the on/off setting unit including selection buttons 3*a* is capable of setting a plurality of groups to the on-state at the same time. In such a case, the volume controller composed of CPU 10 sums attenuation amounts of groups to which the corresponding channel belongs when the groups are set to the on-state, then generates a volume value by attenuating the volume parameter set to the corresponding channel by the summed attenuation amounts, and controls the level of the audio signal of the corresponding channel according to the generated volume value.

Figure 8C:
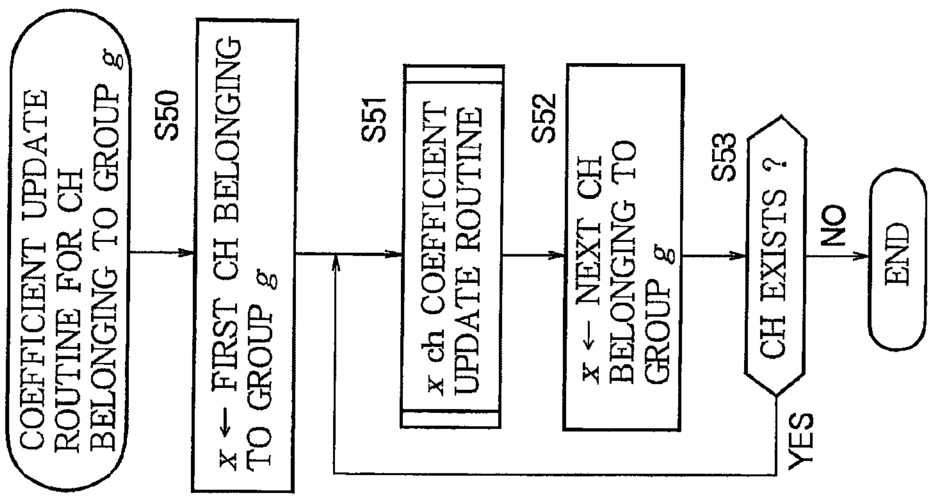
FIGS. 8(*a*), 8(*b*) and 8(*c*) are flowcharts showing an xch fader operating event procedure, a group knob operating event procedure, and a coefficient update routine for channels belonging to a group g, which are executed in the audio signal processing apparatus according to an embodiment of the present invention.
Figure 8B:
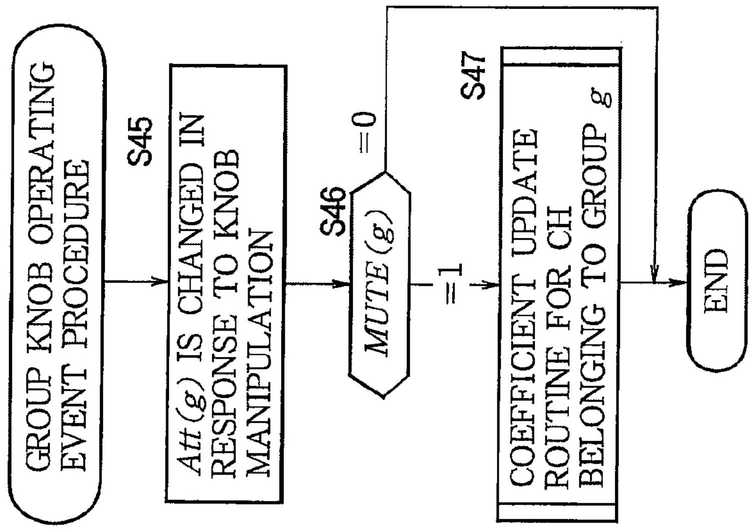
Figure 8A:
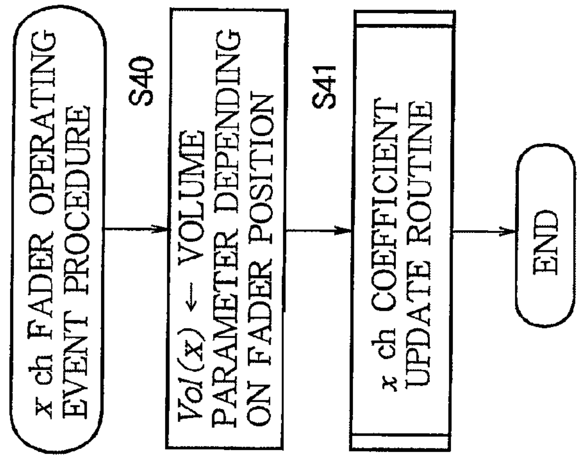

FIG. 8(*a*) is a flowchart showing an xch fader operating event procedure.

The xch fader operating event procedure is initiated when the user manipulates a fader switch 41*c* of a channel strip 40 to which xch is assigned. Upon initiation of the xch fader operating event procedure, attenuation amount [dB] depending on the position of the fader switch 41*c* manipulated by the user is set to the parameter vol(x) of the fader 62 or 71 of xch as the volume parameter in step S40. Then, the xch coefficient update routine A (or B) is executed in step S41 to reflect the renewed value of the parameter vol(x) in coefficient L1(*x*) of the specific step in the procedure of the signal processor 15 to process xch, and the xch fader operating event procedure is finished.

FIG. 8(*b*) is a flowchart showing a mute group knob operating event procedure. The mute group knob operating event procedure is initiated when the user manipulates the knob 4*a* corresponding to the mute group g.

Upon initiation of the mute group knob operating event procedure, an attenuation amount [dB] depending on the position of the knob 4*a* manipulated by the user is set to the parameter Att(g) of the mute group g in step S45. The parameter MUTE(g) of the mute button 4*b* corresponding to the mute group g is checked to determine whether MUTE(g) is "1" (on) or "0" (off) in step S46. When MUTE(g) is "1", which represents that the mute group g is in an on-state, the procedure proceeds to step S47 in which a coefficient update routine for channels belonging to the mute group g is executed. When it is determined that MUTE(g) is "0", which represents that the mute group g is in an off state, in step S46 or when step S47 is finished, the mute group knob operating event procedure is ended.

FIG. 8(*c*) is a flowchart showing a coefficient update routine for channels belonging to the mute group g, which is executed when the parameter Att(g) and the parameter MUTE (g) of the mute group g are changed and this change is reflected in the coefficient of the signal processor 15 (for example, step S47).

Upon initiation of the coefficient update routine for channels belonging to the mute group g, the number of the first channel belonging to the mute group g is set to the register x in step S50. The coefficient update routine A (or B) for xch corresponding to the channel number set to the register x is executed to reflect changed values of the parameters Att(g) and MUTE(g) in the coefficient L1(*x*) of the specific step in the procedure of the signal processor 15 to process xch belonging to the mute group g in step S51. Upon completion of step S51, the number of the next channel belonging to the mute group g is set to the register x in step S52. Then, it is determined whether or not the next channel set to the register x is present in step S53 and, when the next channel set to the register x is present, step S51 is performed on the next channel. When steps S51, S52 and S53 are repeated and thus step S51 is performed on the last channel belonging to the mute group g, it is determined that there is no channel set to the register x in step S53, and the coefficient update routine for the channels belonging to the mute group g is ended.

As described above, the xch coefficient update routine for all the channels belonging to the mute group g is executed (step S51).

Accordingly, changed values of the parameters Att(g) and MUTE(g) of the mute group g are reflected in the coefficient L1(*x*) of the specific step in the procedure of the signal processor 15 to process all the channels belonging to the mute group g.

Figure 9A:
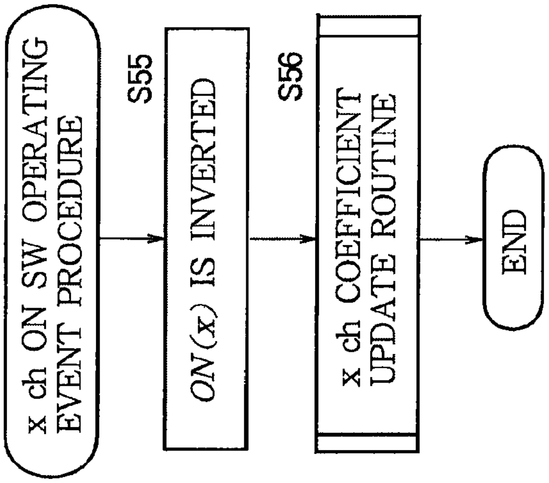
FIGS. 9(*a*) and 9(*b*) are flowcharts showing an xch ON SW operating event procedure and a group mute switch operating event procedure, which are executed in the audio signal processing apparatus according to an embodiment of the present invention.
Figure 9B:
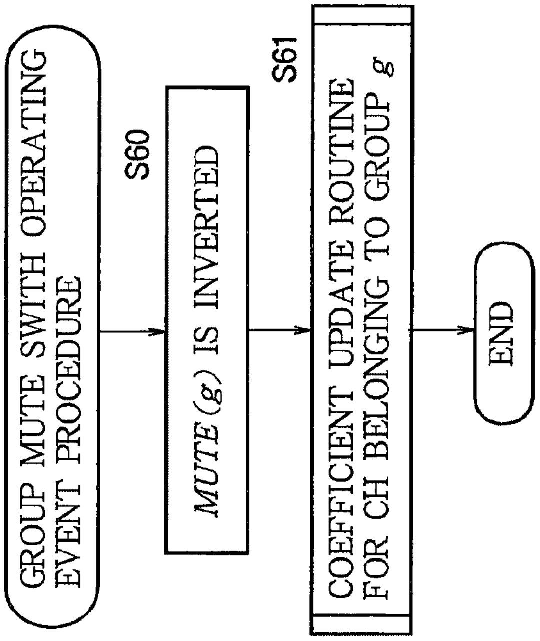

FIG. 9(*a*) is a flowchart showing an xch ON SW operating event procedure. The xch ON SW operating event procedure is initiated when the user manipulates the ON SW 41*b* of a channel strip 40 to which xch is assigned.

Upon initiation of the xch ON SW operating event procedure, the parameter ON(x) of the ON SW 63 or 72 of xch is inverted in step S55. Specifically, ON(x) is changed to "0" (off) when it is "1" (on) and changed to "1" (on) when it is "0" (off). The xch coefficient update routine A (or B) is executed so as to reflect the changed value of ON(x) in the coefficient L1(*x*) of the specific step in the procedure of the signal processor 15 to process xch in step S56, and the xch ON SW operating event procedure is ended.

FIG. 9(*b*) is a flowchart showing a mute switch operating event procedure for the mute group g. The mute switch operating event procedure is initiated when the mute button 4*b* corresponding to the mute group g is manipulated.

Upon initiation of the mute switch operating event procedure, the value of the parameter MUTE(g) is inverted in step S60. Specifically, the value of MUTE(g) is changed to "0" (off) when it is "1" (on) and changed to "1" (on) when it is "0" (off). Subsequently, the coefficient update routine for channels belonging to the mute group g, shown in FIG. 8(*c*), is executed so as to reflect the changed value of the parameter MUTE(g) in the coefficient L1(*x*) of the specific step in the procedure of the signal processor 15 to process xch in step S61, and then the mute switch operating event procedure is ended.

While the two channel coefficient update routines A and B in the aforementioned audio signal processing apparatus according to the embodiments of the present invention have been described, the channel coefficient update routine A is more suitable to meet the demands of listening to music even if its volume level is reduced. The user may select one of the two channel coefficient update routines A and B.

Alternatively, it is possible to reduce the second largest attenuation amount and smaller among attenuation amounts of muted groups to some percents thereof and add them to the largest attenuation amount as a compromise of the two channel coefficient update routines A and B. Namely, the volume controller composed of CPU 10 reduces second largest attenuation amount and smaller attenuation amount among the attenuation amounts of the groups to which the corresponding channel belongs and sums the reduced attenuation amounts to the largest attenuation amount to thereby obtain the summed attenuation amounts.

Though attenuation amounts are represented in decibels [dB] in the audio signal processing apparatus according to the embodiments of the present invention, they may be treated linearly. In this case, addition is changed to multiplication in the embodiments of the present invention.

Furthermore, while the embodiments of the present invention describe the audio signal processing apparatus, the present invention is not limited thereto and can be widely applied to audio apparatuses which process a plurality of channels. For example, the present invention can be applied to an equalizer, compressor, reverberator, recorder, speaker processor, surround amplifier, mixer engine, etc.

The invention claimed is:

1. An audio signal processing apparatus having a plurality of channels for controlling characteristics of a plurality of audio signals, the audio signal processing apparatus comprising:

a volume setting unit that sets respective volume parameters for each of the plurality of channels according to a first user operation;

a group generation unit that determines a plurality of groups, each group including one or more of the plurality of channels according to a second user operation;

an attenuation setting unit that sets an attenuation amount for each of the plurality of groups according to a third user operation;

a mute on/off setting unit that sets each of the plurality of groups to a mute on-state or a mute off-state according to a fourth user operation, the mute on/off setting unit operable for setting more than one group of the plurality of groups to the mute on-state at the same time; and a plurality of volume controllers that are provided in correspondence to the plurality of channels, including:

a first plurality of volume controllers of a first plurality of channels belonging to a group in the mute off-state, wherein each of the first plurality of volume controllers controls a level of an audio signal of its respective channel of the first plurality of channels according to a volume parameter set to its respective channel, a second plurality of volume controllers of a second plurality of channels belonging to a group in the mute on-state, wherein each of the second plurality of volume controllers:

generates a volume value of its respective channel of the second plurality of channels by attenuating a volume parameter set to its respective channel by the attenuation amount set to the group in the mute on-state, and controls a level of an audio signal of its respective channel according to the generated volume value of its respective channel; and wherein the second plurality of volume controllers includes a volume controller Y of a channel Z belonging to more than one group in the mute on-state, the channel Z included among the second plurality of channels, wherein the volume controller Y:

generates a volume value of the channel Z by attenuating a volume parameter set to the channel Z by a largest of the attenuation amounts set for the more than one group in the mute-on state, and controls a level of an audio signal of the channel Z according to the generated volume value of the channel Z.

2. The audio signal processing apparatus according to claim 1, further comprising a mute safe setting unit that specifies a channel of the plurality of channels which is temporarily excluded from any of the groups of the plurality of groups such that a volume value of the specified channel is not affected even when any of the groups of the plurality of groups to which the specified channel belongs is in the mute on-state.

3. An audio signal processing apparatus having a plurality of channels for controlling characteristics of a plurality of audio signals, the audio signal processing apparatus comprising:

a volume setting unit that sets respective volume parameters for each of the plurality of channels according to a first user operation;

a group generation unit that determines a plurality of groups, each group including one or more of the plurality of channels according to a second user operation;

an attenuation setting unit that sets an attenuation amount for each of the plurality of groups according to a third user operation;

a mute on/off setting unit that sets each of the plurality of groups to a mute on-state or a mute off-state according to a fourth user operation, the mute on/off setting unit operable for setting more than one group of the plurality of groups to the mute on-state at the same time; and a plurality of volume controllers that are provided in correspondence to the plurality of channels, including:

a first plurality of volume controllers of a first plurality of channels belonging to a group in the mute off-state, wherein each of the first plurality of volume controllers controls a level of an audio signal of its respective channel of the first plurality of channels according to a volume parameter set to its respective channel, a second plurality of volume controllers of a second plurality of channels belonging to a group in the mute on-state, wherein each of the second plurality of volume controllers:

generates a volume value of its respective channel of the second plurality of channels by attenuating a volume parameter set to its respective channel by the attenuation amount set to the group in the mute on-state, and controls a level of an audio signal of its respective channel according to the generated volume value of its respective channel; and wherein the second plurality of volume controllers includes a volume controller Y of a channel Z belonging to more than one group in the mute on-state, the channel Z included among the second plurality of channels, wherein the volume controller Y:

reduces every attenuation amount of the more than one group in the mute on-state that is smaller than a largest attenuation amount of the more than one group in the mute on-state, sums the reduced attenuation amounts with the largest attenuation amount to thereby obtain a summed attenuation amount, generates a volume value of the channel Z by attenuating a volume parameter set to the channel Z by the summed attenuation amount, and controls a level of the audio signal of the channel Z according to the generated volume value of the channel Z.

4. The audio signal processing apparatus according to claim 3, further comprising a mute safe setting unit that specifies a channel of the plurality of channels which is temporarily excluded from any of the groups of the plurality of groups such that a volume value of the specified channel is not affected even when any of the groups of the plurality of groups to which the specified channel belongs is in the mute on-state.

5. An audio apparatus having a plurality of channels for controlling characteristics of a plurality of audio signals, the audio apparatus comprising:

an electric fader for setting respective volume parameters for each of the plurality of channels according to a first user operation;

a set of user-manipulatable controls configured to:

determine a plurality of groups, each group including one or more of the plurality of channels according to a second user operation, set an attenuation amount for each of the plurality of groups according to a third user operation, and set each of the plurality of groups to a mute on-state or a mute off-state according to a fourth user operation, the mute on/off setting unit operable for setting more than one group of the plurality of groups to the mute on-state at the same time; and a processor implementing a plurality of volume controllers that are provided in correspondence to the plurality of channels, including:

a first plurality of volume controllers of a first plurality of channels belonging to a group in the mute off-state, wherein each of the first plurality of volume controllers controls a level of an audio signal of its respective channel of the first plurality of channels according to a volume parameter set to its respective channel, a second plurality of volume controllers of a second plurality of channels belonging to a group in the mute on-state, wherein each of the second plurality of volume controllers:

generates a volume value of its respective channel of the second plurality of channels by attenuating a volume parameter set to its respective channel by the attenuation amount set to the group in the mute on-state, and controls a level of an audio signal of its respective channel according to the generated volume value of its respective channel; and wherein the second plurality of volume controllers includes a volume controller Y of a channel Z belonging to more than one group in the mute on-state, the channel Z included among the second plurality of channels, wherein the volume controller Y:

generates a volume value of the channel Z by attenuating a volume parameter set to the channel Z by a largest of the attenuation amounts set for the more than one group in the mute-on state, and controls a level of an audio signal of the channel Z according to the generated volume value of the channel Z.

6. The audio apparatus according to claim 5, wherein the user-manipulatable controls are also for specifying a channel of the plurality of channels which is temporarily excluded from any of the groups of the plurality of groups such that a volume value of the specified channel is not affected even when any of the groups of the plurality of groups to which the specified channel belongs is in the mute on-state.

7. An audio apparatus having a plurality of channels for controlling characteristics of a plurality of audio signals, the audio apparatus comprising:

an electric fader for setting respective volume parameters for each of the plurality of channels according to a first user operation;

a set of user-manipulatable controls configured to:

determine a plurality of groups, each group including one or more of the plurality of channels according to a second user operation, set an attenuation amount for each of the plurality of groups according to a third user operation, and set each of the plurality of groups to a mute on-state or a mute off-state according to a fourth user operation, the mute on/off setting unit operable for setting more than one group of the plurality of groups to the mute on-state at the same time; and a processor implementing a plurality of volume controllers that are provided in correspondence to the plurality of channels, including:

a first plurality of volume controllers of a first plurality of channels belonging to a group in the mute off-state, wherein each of the first plurality of volume controllers controls a level of an audio signal of its respective channel of the first plurality of channels according to a volume parameter set to its respective channel, a second plurality of volume controllers of a second plurality of channels belonging to a group in the mute on-state, wherein each of the second plurality of volume controllers:

generates a volume value of its respective channel of the second plurality of channels by attenuating a volume parameter set to its respective channel by the attenuation amount set to the group in the mute on-state, and controls a level of an audio signal of its respective channel according to the generated volume value of its respective channel; and wherein the second plurality of volume controllers includes a volume controller Y of a channel Z belonging to more than one group in the mute on-state, the channel Z included among the second plurality of channels, wherein the volume controller Y:

reduces every attenuation amount of the more than one group in the mute on-state that is smaller than a largest attenuation amount of the more than one group in the mute on-state, sums the reduced attenuation amounts with the largest attenuation amount to thereby obtain a summed attenuation amount, generates a volume value of the channel Z by attenuating a volume parameter set to the channel Z by the summed attenuation amount, and controls a level of the audio signal of the channel Z according to the generated volume value of the channel Z.

8. The audio apparatus according to claim 7, wherein the user-manipulatable controls are also for specifying a channel of the plurality of channels which is temporarily excluded from any of the groups of the plurality of groups such that a volume value of the specified channel is not affected even when any of the groups of the plurality of groups to which the specified channel belongs is in the mute on-state.

* * * * *